United States Patent
Nagase

(10) Patent No.: US 7,819,337 B2
(45) Date of Patent: Oct. 26, 2010

(54) PIEZO INJECTOR AND PIEZO INJECTOR SYSTEM

(75) Inventor: Noboru Nagase, Anjo (JP)

(73) Assignee: DENSO CORPORATION, Kariya (JP)

(*) Notice: Subject to any disclaimer, the term of this patent is extended or adjusted under 35 U.S.C. 154(b) by 328 days.

(21) Appl. No.: 11/819,545

(22) Filed: Jun. 28, 2007

(65) Prior Publication Data

US 2008/0006724 A1  Jan. 10, 2008

(30) Foreign Application Priority Data

Jul. 4, 2006  (JP) .............................. 2006-184593

(51) Int. Cl.
  *B05B 1/08*  (2006.01)
  *B05B 3/04*  (2006.01)

(52) U.S. Cl. ................. 239/102.2; 239/584; 239/585.1; 123/498; 123/445; 251/129.06

(58) Field of Classification Search .............. 239/102.1, 239/102.2, 585.1, 584; 251/129.06; 123/498, 123/445
See application file for complete search history.

(56) References Cited

U.S. PATENT DOCUMENTS

| | | | | |
|---|---|---|---|---|
| 4,974,780 | A * | 12/1990 | Nakamura et al. | 239/102.2 |
| 5,193,745 | A * | 3/1993 | Holm | 239/102.2 |
| 5,330,100 | A * | 7/1994 | Malinowski | 239/102.2 |
| 5,543,679 | A | 8/1996 | Morino et al. | |
| 6,147,433 | A | 11/2000 | Reineke et al. | |
| 6,279,842 | B1 * | 8/2001 | Spain | 239/585.1 |
| 6,758,408 | B2 * | 7/2004 | Czimmek | 239/5 |
| 6,907,864 | B2 * | 6/2005 | Takemoto | 123/478 |
| 6,929,192 | B2 * | 8/2005 | Schmauser | 239/102.2 |
| 2003/0029940 | A1 | 2/2003 | Smith, III et al. | |

FOREIGN PATENT DOCUMENTS

| | | |
|---|---|---|
| DE | 197 55 601 A1 | 6/1999 |
| DE | 10 2004 026250 A1 | 2/2005 |
| DE | 10 2004 046192 A1 | 4/2006 |
| EP | 1 382 824 A2 | 1/2004 |
| JP | H02-188664 A2 | 7/1990 |
| JP | H04-043854 A2 | 2/1992 |
| JP | H06-264810 A2 | 9/1994 |
| JP | 2000-045910 A2 | 2/2000 |
| JP | 2001-082281 A | 3/2001 |
| JP | 2002-101673 A2 | 4/2002 |
| JP | 2005-016431 A2 | 1/2005 |
| WO | WO 2007/135339 A1 | 11/2007 |

OTHER PUBLICATIONS

Extended European Search Report dated Feb. 3, 2010 issued from the European Patent Office in corresponding European patent application No. 07011403.8-2311.
Notification of Reasons for Rejection dated Apr. 20, 2010 issued from the Japanese Patent Office in the corresponding Japanese patent application No. 2006-184593 (with English translation).

* cited by examiner

*Primary Examiner*—Dinh Q Nguyen
(74) *Attorney, Agent, or Firm*—Posz Law Group, PLC

(57) ABSTRACT

The piezo injector includes a piezo element expanding when electrical charges supplied from an external DC source are accumulated therein, and contracting when the electrical charges are discharged therefrom, an open/close valve opening and closing in accordance with expansion and contraction of the piezo element, a housing containing therein the piezo element and the open/close valve, and an inductor element through which the electrical charges are accumulated in and discharged from the piezo element.

10 Claims, 5 Drawing Sheets

PIEZO INJECTOR AND PIEZO INJECTOR SYSTEM

CROSS-REFERENCE TO RELATED APPLICATION

This application is related to Japanese Patent Application No. 2006-184593 filed on Jul. 4, 2006, the contents of which are hereby incorporated by reference.

BACKGROUND OF THE INVENTION

1. Field of the Invention

The present invention relates to a piezo injector, and a piezo injector system including a plurality of piezo injectors and a piezo injector driving apparatus useable for a vehicle having an internal combustion engine, particularly a diesel engine.

2. Description of Related Art

As shown in FIG. 4, a commonly used piezo injector is constituted by a piezo element P, a fuel injection valve 101 configured to open and close in accordance with expansion and contraction of the piezo element P, and a housing 103 containing therein the piezo element P and the fuel injection valve 101.

To drive such a piezo injector, a piezo injector driving apparatus is used. The piezo injector driving apparatus is configured to charge and discharge the piezo element P in order to cause the piezo element P to expand and contract. Since the piezo element P is a capacitive load, if the piezo element P is supplied with a current directly from a DC power source, there is a fear that a charging current flowing into the piezo element P increases excessively, causing the piezo element P to be damaged.

Accordingly, it is necessary to prevent the charging current from exceeding an allowable range of the piezo element P at the time of charging the piezo element P. On the other hand, to increase the response of the piezo injector (fuel injection response), it is necessary to shorten the time needed for the charging current to reach a predetermined value.

For such reasons, as shown in FIG. 5, it is common that the piezo injector driving apparatus 105 includes an inductor element L having an inductance component such as a coil or a transformer disposed between the DC power source 107 and the piezo elements P in order to prevent the piezo elements P from being damaged and suppress loss of the charging current, while shorting the time needed for the charging current to reach the predetermined value. For detail, refer to Japanese Patent Application Laid-open No. 2005-16431, for example.

In a case where a current or a voltage applied to the piezo element P at the time of charging the piezo element P is increased in order to increase the opening/closing speed of the fuel injection valve 101 under a high common rail pressure (fuel regulation pressure) environment, the inductor element L has to be increased in size to prevent the piezo element P from being damaged, for the reasons described below.

The piezo injector has an ability to open and close the fuel injection valve at high speed compared to the so-called solenoid injector configured to open and close the fuel injection valve by use of a solenoid coil. Accordingly, with the piezo injector, it is possible to reduce exhaust emission. In addition, with the piezo injector, it is possible to increase an output power of an engine, because the piezo injector can inject fuel under high fuel pressure. However, for the piezo injector to operate under the condition of high fuel pressure, a voltage across the piezo element P has to be sufficiently large, because the load applied to the piezo element P is large in such a condition. And accordingly, to increase the opening/closing speed of the fuel injection valve, the charging current has to be sufficiently large so that the speed of the increase of the voltage across the piezo element P is sufficiently fast.

However, increasing the charging current requires increasing the size of the inductor element L, which causes upsizing of the piezo injector driving apparatus.

SUMMARY OF THE INVENTION

The present invention provide a piezo injector comprising:

a piezo element expanding when electrical charges supplied from an external DC source are accumulated therein, and contracting when the electrical charges are discharged therefrom;

an open/close valve opening and closing in accordance with expansion and contraction of the piezo element;

a housing containing therein the piezo element and the open/close valve; and an inductor element through which the electrical charges are accumulated in and discharged from the piezo element.

The present invention also provides a piezo injector system comprising:

a piezo injector; and a piezo injector driving apparatus;

the piezo injector including:

a piezo element expanding when electrical charges supplied from the piezo injector driving apparatus are accumulated therein, and contracting when the electrical charges are discharged therefrom;

an open/close valve opening and closing in accordance with expansion and contraction of the piezo element;

a housing containing therein the piezo element and the open/close valve; and an inductor element through which the electrical charges are accumulated in and discharged from the piezo element;

the piezo injector driving apparatus including a switch device operating to charge and discharge the piezo element through the inductor element in accordance with an injection signal outputted from an external control device.

According to the present invention, since the inductor element through which the electrical charges are accumulated in and discharged from the piezo element is provided in the piezo injector, it becomes possible to apply the piezo element with a large voltage or a large current without upsizing the piezo injector driving apparatus.

The inductor element may be contained in the housing.

The piezo injector may further comprise a connector for connection with a piezo injector driving apparatus, the inductor element being connected between the connector and the piezo element.

The piezo injector may further comprise a protection member covering the connector, and the inductor element.

At least a part of the housing may be made of magnetic material, and the housing may be used as a core of the inductor element. The magnetic material may be steel or ferrite.

The inductor element may be a coil wound around an outer periphery of the housing. Alternatively the inductor element may be a coil wound along an inner periphery of the housing.

Other advantages and features of the invention will become apparent from the following description including the drawings and claims.

PREFERRED EMBODIMENTS OF THE INVENTION

First Embodiment

Figure 1:
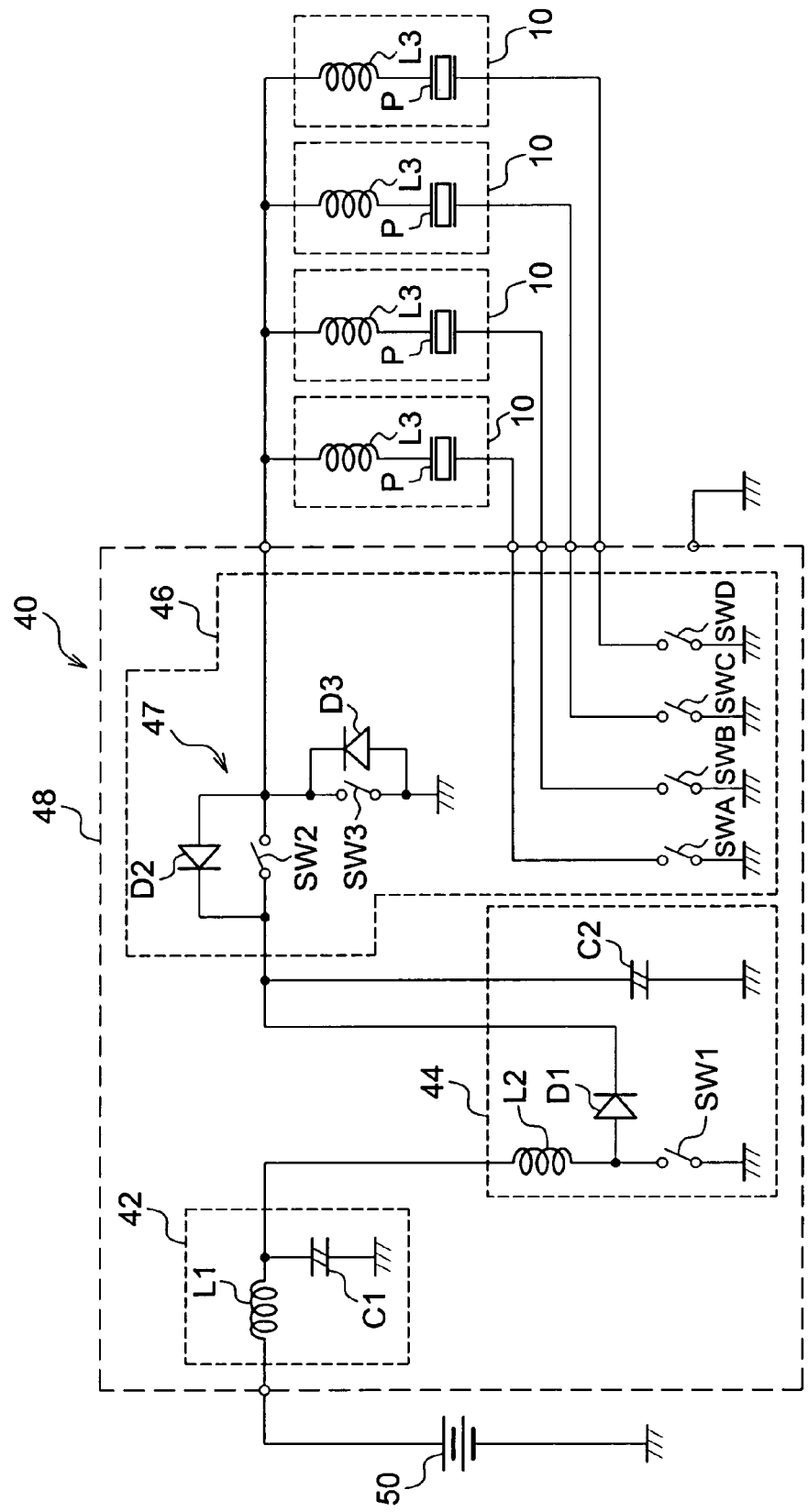
FIG. 1 is a diagram showing a structure of an injector system according a first embodiment of the invention.

FIG. 1 is a diagram showing a structure of a piezo injector system according to a first embodiment of the invention.

This piezo injector system, which is mounted on a vehicle having a common-rail type four-cylinder diesel engine, includes four piezo injectors 10 for injecting fuel into the diesel engine, and a piezo injector driving apparatus 40 for driving these piezo injectors 10.

The injector driving apparatus 40 includes a filter circuit 42, a DC-DC converter 44, an EDU (Electronic Driver Unit) 46, and a housing 48 containing therein the filter circuit 42, the DC-DC converter 44, and the EDU 46.

The filter circuit 42, which is an LC filter constituted by a filtering coil L1 and a filtering capacitor C1, is connected to a positive terminal of a vehicle battery 50 at one end of the filtering coil L1, and connected to an input end of the DC-DC converter 44 at the other end of the filtering coil L1.

The filtering capacitor C1 is connected to a node between the filtering coil L1 and the input end of DC-DC converter 44 at one end thereof, and grounded at the other end thereof. The DC-DC converter 44, which is for generating a DC voltage higher than the voltage of the vehicle battery 50 applied at the input end thereof through the filter circuit 42, includes a step-up coil L2, a step-up switch SW1, a DC-DC capacitor C2, and a discharge preventing diode D1.

The step-up coil L2 is connected to the filtering coil L1 of the filter circuit 42 at one end thereof, and grounded at the other end thereof through the step-up switch SW1. The discharge preventing diode D1 is connected to a node between the step-up coil L2 and the step-up switch SW1 at an anode thereof, and connected to an input end of the EDU 46 at a cathode thereof.

The DC-DC capacitor C2 is grounded at one end thereof, and connected to a node between the cathode of the discharge preventing diode D1 and the input end of the EDU 46 at the other end thereof. The step-up switch SW1 is turned on and off repeatedly by a not shown step-up control circuit, so that the DC-DC capacitor C2 is supplied with energy accumulated in the step-up coil L2.

As a result, the DC-DC capacitor C2 is accumulated with electrical charges, and the voltage higher than the voltage of the battery 50 is generated across the DC-DC capacitor C2. In this embodiment, the battery 50 generates a voltage of 12V, while the DC-DC converter 44 generates a high voltage of several tens to several hundreds of volts.

The EDU 46 includes a driver section 47 which is supplied with electric power from the DC-DC converter 44 and drives the piezo injectors 10, and cylinder selection switches SWA to SWD. The driver section 47 includes a charge switch SW2, a discharge switch SW3, a regenerative diode D2, and a flywheel diode D3. The driver section 47 drives the piezo injectors 10 by turning on and off the charge switch SW2 and the discharge switch SW3 in accordance with an injection signal outputted from a not shown ECU (Electronic Control Unit) performing an engine control.

The charge switch SW2 is connected to the cathode of the discharge preventing diode D1 at one end thereof, and connected to one end of each piezo injector 10 at the other end thereof. The discharge switch SW3 is connected to a node between the charge switch SW2 and the piezo injectors 10 at one end thereof, and grounded at the other end thereof.

The regenerative diode D2 is connected to the piezo injector 10 side end of the charge switch SW2 at an anode thereof, and connected to the DC-DC converter 44 side end of the charge switch SW2 at a cathode thereof.

The flywheel diode D3 is connected to the ground-side end of the discharge switch SW3 at an anode thereof, and connected to the charge switch SW2-side end of the discharge switch SW3 at a cathode thereof.

The four cylinder selection switches SWA to SWD are for selecting, as a drive object, one of the four piezo injectors 10 provided for four cylinders of the engine.

Figure 2:
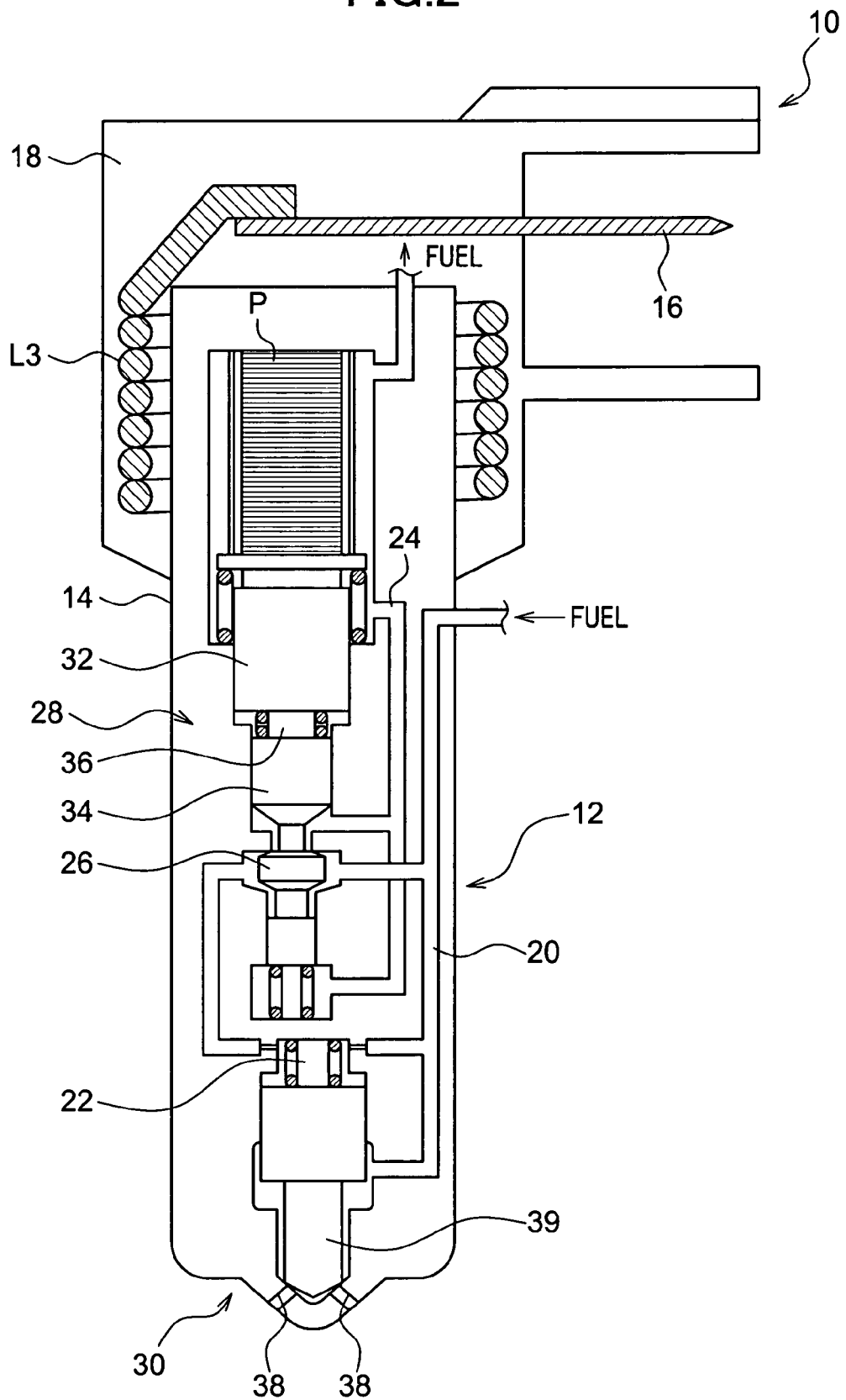
FIG. 2 is a diagram showing a structure of a piezo injector included in the injector system shown in FIG. 1.
Figure 3:
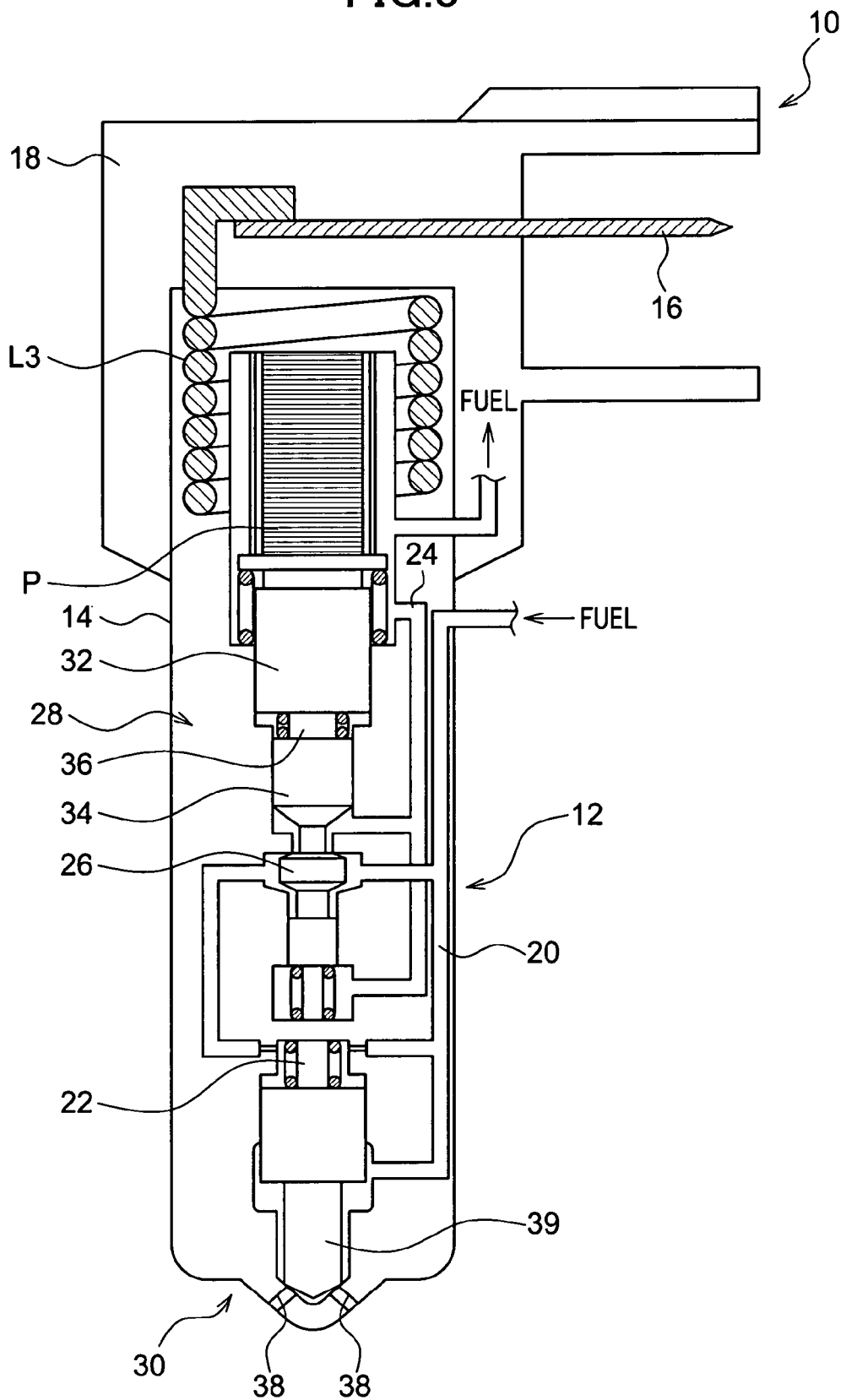
FIG. 3 is a diagram showing a structure of a piezo injector according to a second embodiment of the invention.
Figure 4:
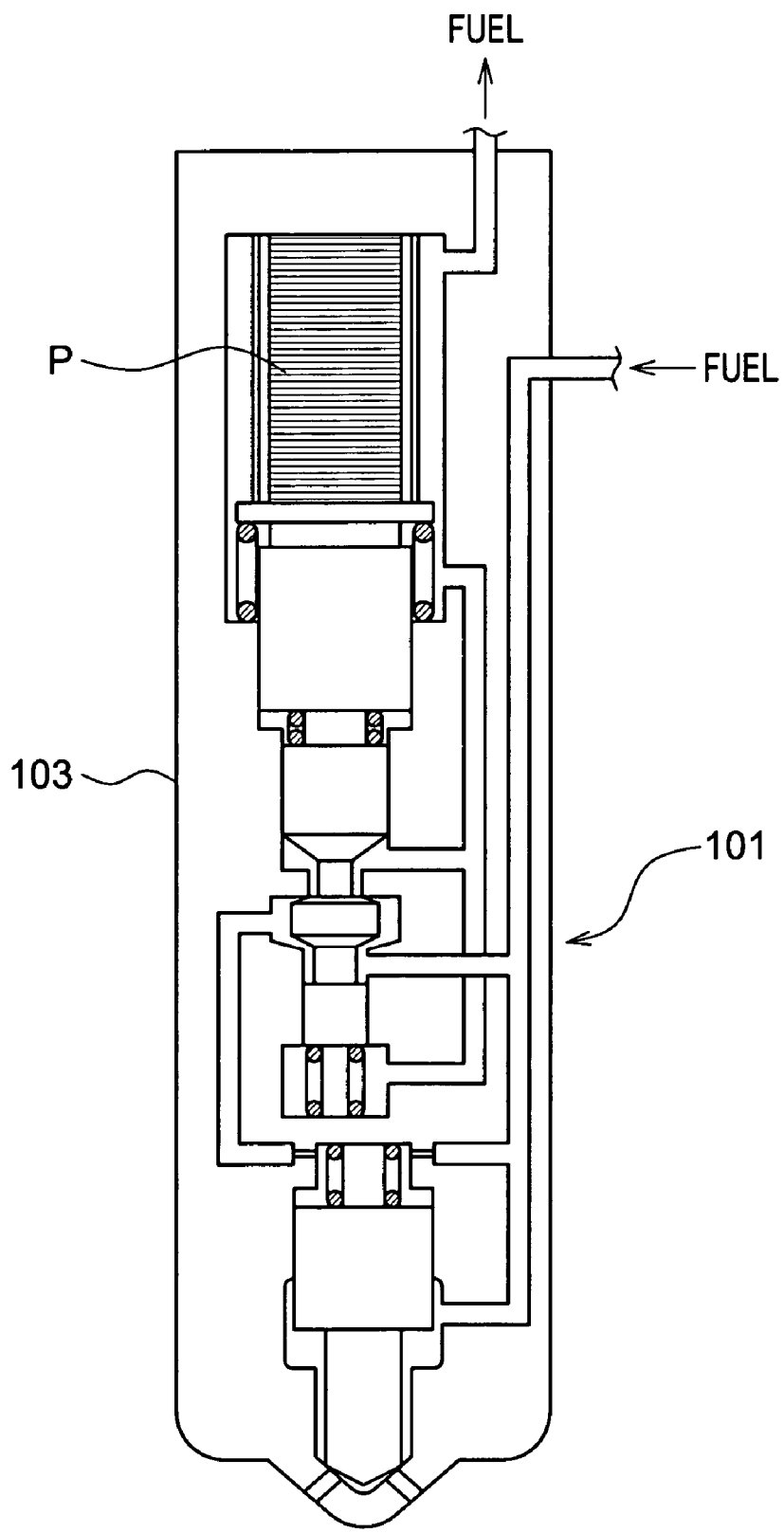
FIG. 4 is a diagram showing a structure of a conventional piezo injector.
Figure 5:
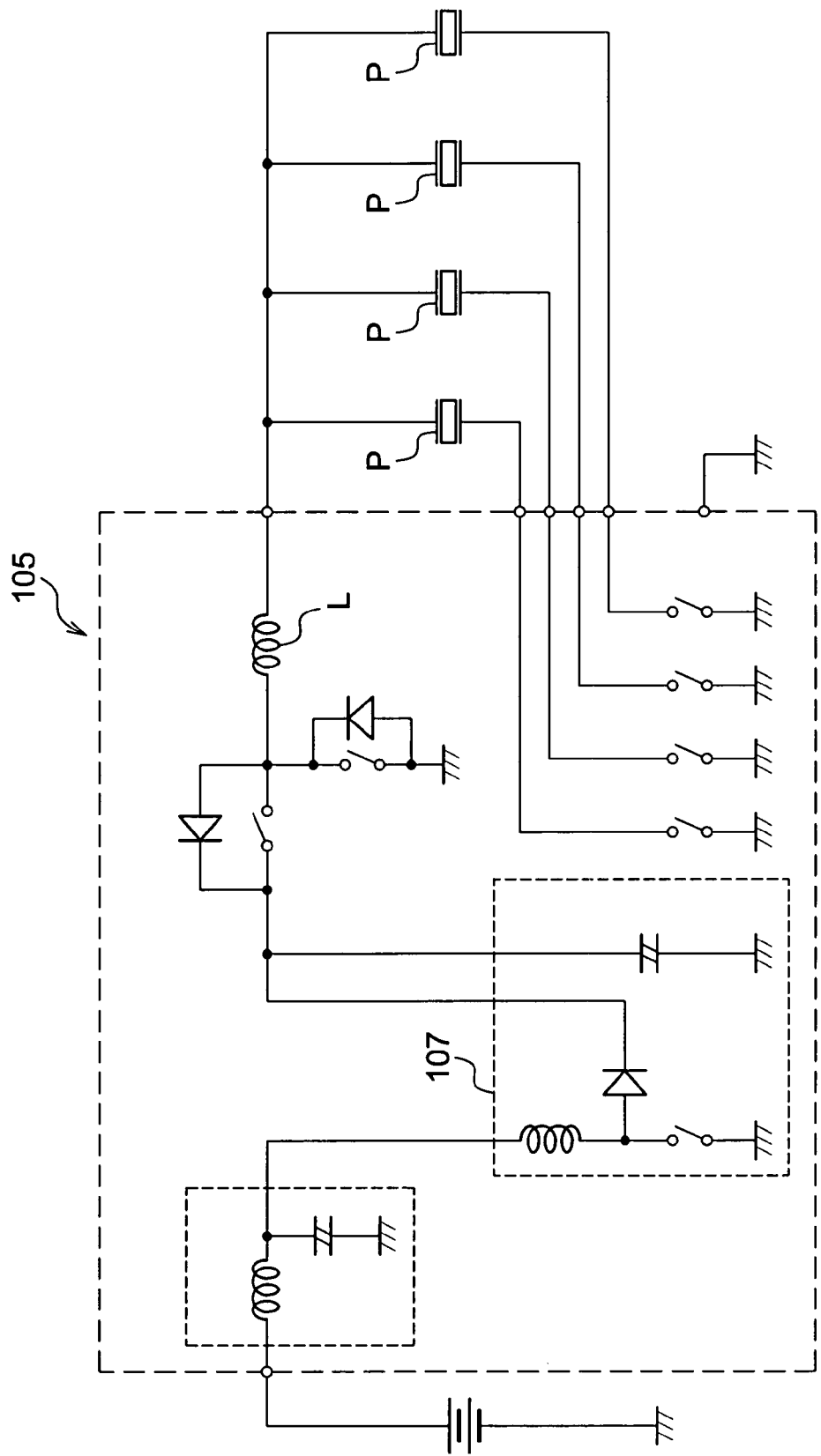
FIG. 5 is a diagram showing a structure of a conventional injector system.

Each of the cylinder selection switches SWA to SWD is grounded at one end thereof, and connected to a corresponding one of the piezo injectors 10 at the other end thereof. FIG. 2 is a diagram showing the structure of the piezo injector 10.

The piezo injector 10 provided for each of the four cylinders of the engine operates utilizing the expansion and contraction of the piezo element P. The piezo injector 10 is configured to receive high pressure fuel from a common rail, and inject it to a combustion chamber of each cylinder from a fuel injection valve 12.

A part of the fuel supplied to the piezo injector 10 other than the part being injected to the combustion chamber is used for providing the piezo injector 10 with a control oil pressure. This part of the fuel for providing the control oil pressure is returned to a fuel tank through a low-pressure drain line (not shown).

The piezo injector 10, which has a bar-like shape, is mounted to the engine in such a state that a front end (a lower end in FIG. 2) thereof projects into the combustion chamber.

As shown in FIG. 2, the piezo injector 10 includes the piezo element P, the fuel injection valve 12, an injector housing 14 containing therein the piezo element P and the fuel injection valve 12, a charge/discharge coil L3, a connector 16 for connection to the injector driving apparatus 40, and a connector case 18 as a protection member containing therein the connector 16 and the charge/discharge coil L3.

The piezo element P, which expands when electrical charges supplied from the DC-DC converter 44 are accumulated therein, and contracts when the accumulated electrical charges are discharged therefrom, is contained in the housing 14 in such a state that the direction of the expansion and contraction is nearly parallel to the longitudinal direction of the piezo injector 10.

The piezo element P is connected to the piezo injector 10-side end of the charge switch SW2 at one end thereof through the charge/discharge coil L3, and connected to a corresponding one of the cylinder selection switches SWA to SWD at the other end thereof (see FIG. 1).

The charge/discharge coil L3 having an inductance component is provided for the purpose of shortening the time needed for the charging current to reach a predetermined value, while preventing the piezo element P from being damaged, and suppressing loss of the charging current flowing into the piezo element P from the DC-DC capacitor C2.

The injector housing 14 is made of magnetic material such as ferrite or steel. An upper outer periphery of the injector housing 14, around which the charge/discharge coil L3 is wound, is covered with the connector case 18.

In this embodiment, the injector housing 14 is used as a core of the charge/discharge coil L3. The fuel injection valve 12, which operates to open and close a fuel injection hole 38 in accordance with the expansion and contraction of the piezo element P, is constituted by a high pressure channel 20 connected to the common rail, a back-pressure chamber 22 formed on the high pressure channel 20, a low pressure channel 24 connected to the drain line, a switch valve 26 for making and breaking communication between the back-pressure chamber 22 and the low pressure channel 24, a displacement magnifying mechanism 28 to magnify the expansion of the piezo element and transmitting it to the switch valve 26, and a fuel injection section 30.

The displacement magnifying mechanism 28 includes a large-diameter piston 32 and a small-diameter piston 34 whose diameter is smaller than that of the large-diameter piston 32. The piezo element P is disposed above the large-diameter piston 32 below which a displacement magnifying chamber 36 charged with fuel is disposed. The small-diameter piston 34 is disposed below the displacement magnifying chamber 36.

When the piezo element P expands, the large-diameter piston 32 moves down in accordance with the expansion of the piezo element P. When the large-diameter piston 32 moves down, the fuel in the displacement magnifying chamber 36 is pressed. The resultant pressure is transmitted to the small-diameter piston 34, and as a result, the small-diameter piston 34 moves down.

Since the diameter of the small-diameter piston 34 is smaller than that of the large-diameter piston 32, the displacement of small-diameter piston 34 is larger than that of the large-diameter piston 32. When the piezo element P expands, the switch valve 26 disposed below the small-diameter piston 34 is pushed down, as a result of which the back-pressure chamber 22 and the low pressure channel 24 are communicated to each other. On the other hand, when the piezo element P contracts, the back-pressure chamber 22 and the low pressure channel 24 are blocked from each other.

The fuel injection section 30 includes the fuel injection holes 38 formed in the lower end of the injector housing 14, and a needle 39 disposed in the back-pressure chamber 22 for opening and closing the fuel injection holes 38. The needle 39 moves up to open the fuel injection holes 38 when the back-pressure chamber 22 and the low pressure channel 24 are communicated to each other, and the fuel pressure in the back-pressure chamber 22 is lowered accordingly.

On the other hand, when the piezo element P contracts, since the back-pressure chamber 22 and the low pressure channel 24 are blocked from each other to cause the fuel pressure in the back-pressure chamber 22 to rise, the needle 39 moves down to close the fuel injection holes 38. As explained above, when the piezo element P is charged to expand, the large-diameter piston 32 and the small-diameter piston 34 move down. As a consequence, the back-pressure chamber 22 and the low pressure channel 24 are communicated to each other to move up the needle 39. This causes the fuel injection holes 38 to open to start fuel injection.

On the other hand, when the piezo element P is discharged to contract, the large-diameter piston 32 and the small-diameter piston 34 move up. As a consequence, the back-pressure chamber 22 and the low pressure channel 24 are blocked from each other to move down the needle 39. This causes the fuel injection holes 38 to close to stop fuel injection.

In the piezo injector system having the configuration described above, the injection signal is inputted to the EDU 46 from the ECU for identifying one of the four piezo injectors 10, which is to inject fuel at the time.

In response to the injection signal, the EDU 47 turns on one of the cylinder selection switches SWA to SWD which is identified by the injection signal. And then the EDU 46 turns on and off the charge switch SW2 repeatedly with the discharge switch SW3 being kept off.

It results that a current flows into the piezo element P from the DC-DC capacitor C2, and energy is accumulated in the charge/discharge coil L3 when the charge switch SW2 is turned on. On the other hand, when the charge switch SW2 is turned off, the energy accumulated in the charge/discharge coil L3 is supplied to the piezo element P in the form of a current, as a consequence of which the piezo element P is charged with electrical charges to expand to start fuel injection.

When the supply of the injection signal to the EDU 46 is stopped, the EDU 46 turns on and off the discharge switch SW3 repeatedly with the charge switch SW2 being kept off. It results that a current flows from a positive electrode side of the piezo element P, and energy is accumulated in the charge/discharge coil L3 when the discharge switch SW3 is turned on. On the other hand, when the discharge switch SW3 is turned off, the energy accumulated in the charge/discharge coil L3 is supplied to the piezo element P in the form of a regenerative current flowing into the DC-DC capacitor 2, as a consequence of which the electrical charges accumulated in the piezo element P are discharged causing the piezo element P to contract to stop the fuel injection.

In a conventional piezo injector system as disclosed in Japanese Patent Application Laid-open No. 2005-16431, an inductor element corresponding to the charge/discharge coil L3 is provided in its piezo injector driving apparatus. While on the other hand, in this embodiment, the charge/discharge coil L3 is provided in the piezo injector 10. Accordingly, according to this embodiment, increasing the size of the charge/discharge coil L3 for allowing the piezo element P to be applied with a large voltage or a current is possible without upsizing the piezo injector driving apparatus 40.

According to this embodiment, the injector drive apparatus 40 can be made smaller in size than was previously possible, because it does not include the charge/discharge coil L3.

In addition, the heat emitted from the injector drive apparatus 40 of this embodiment can be made smaller than that emitted from the conventional injector drive apparatus disclosed in Japanese Patent Application Laid-open No. 2005-16431 by an amount of the heat emitted from the charge/discharge coil L3.

According to this embodiment, since the charge/discharge coil L3 is housed in the piezo injector 10, it is possible to reduce the man-hours needed to mount the piezo injector 10 to the vehicle. In addition, since the charge/discharge coil L3 is covered by the connector case 18, the charge/discharge coil L3 can be protected from external forces and shocks.

According to this embodiment, since the injector housing 14 made of magnetic material is used as the core of the charge/discharge coil L3, the number of components of the piezo injector 10 is small compared to the conventional one in which the core of the charge/discharge coil L3 is provided separately.

Second Embodiment

In the first embodiment, the charge/discharge coil L3 is wound around the outer periphery of the injector housing 14 to use the injector housing 14 as a core of the charge/discharge coil L3. While on the other hand, in the second embodiment, the charge/discharge coil L3 is wound along the inner periphery of the injector housing 14. Also in this case, the injector housing 14 can be used as the core of the charge/discharge coil L3.

According to the second embodiment, as in the first embodiment, since the charge/discharge coil L3 is provided in the piezo injector 10, increasing the size of the charge/discharge coil L3 for allowing the piezo element P to be applied with a large voltage or a current is possible without upsizing the injector drive apparatus 40.

Other Embodiments

In the above described embodiments, the charge/discharge coil L3 is provided in the piezo injector 10, however, it may be provided in the housing 48 of the injector drive apparatus 40, or between the injector drive apparatus 40 and the piezo injector 10.

In the above described embodiments where the charge/discharge coil L3 is provided in the piezo injector 10, it is possible to accumulate a desired amount of energy (electrical charges) in the piezo element P at the time of charging the piezo element P irrespective of the size of the charge/discharge coil L3 by providing the injector drive apparatus 40 with appropriate circuitry.

Such circuitry may be constituted by a current detecting resistor detecting a charging current flowing into the piezo element P from the DC-DC capacitor C2, an integrating circuit integrating the charging current, and a judging circuit judging whether or not the integrated charging current outputted from the integrating circuit has reached a first target value, or reached a second target value. In this configuration, the injector drive apparatus 40 turns on off the charge switch SW2 when the judging circuit judges that the integrated charging current has reached the first target value, and turns on the charge switch SW2 when the judging circuit judges that the integrated charging current has reached the second target value.

According to this configuration, since the charging current flowing from the DC-DC capacitor 2 to the piezo element 10 is controlled at a constant value, the energy (electrical charges) accumulated in the piezo element P at the time of charging the piezo element P can be kept at a desired value irrespective of the size of the charge/discharge coil L3

The above explained preferred embodiments are exemplary of the invention of the present application which is described solely by the claims appended below. It should be understood that modifications of the preferred embodiments may be made as would occur to one of skill in the art.

What is claimed is:

1. A piezo injector comprising:
a piezo element expanding when electrical charges supplied from an external DC source are accumulated therein, and contracting when said electrical charges are discharged therefrom;
an open/close valve opening and closing in accordance with expansion and contraction of said piezo element;
a housing containing therein said piezo element and said open/close valve; and
an inductor element through which said electrical charges are accumulated in and discharged from said piezo element,
wherein at least a part of said housing is made of magnetic material, and said housing is used as a core of said inductor element.

2. The piezo injector according to claim 1, wherein said inductor element is contained in said housing.

3. The piezo injector according to claim 2, further comprising a connector for connection with a piezo injector driving apparatus, said inductor element being connected between said connector and said piezo element.

4. The piezo injector according to claim 3, further comprising a protection member covering said connector, and said inductor element.

5. The piezo injector according to claim 1, wherein said magnetic material is steel.

6. The piezo injector according to claim 1, wherein said magnetic material is ferrite.

7. The piezo injector according to claim 1, wherein said inductor element is a coil wound around an outer periphery of said housing.

8. The piezo injector according to claim 1, wherein said inductor element is a coil wound along an inner periphery of said housing.

9. A piezo injector system comprising:
a piezo injector; and
a piezo injector driving apparatus;
said piezo injector including:
a piezo element expanding when electrical charges supplied from said piezo injector driving apparatus are accumulated therein, and contracting when said electrical charges are discharged therefrom;
an open/close valve opening and closing in accordance with expansion and contraction of said piezo element;
a housing containing therein said piezo element and said open/close valve; and
an inductor element through which said electrical charges are accumulated in and discharged from said piezo element;
said piezo injector driving apparatus including a switch device operating to charge and discharge said piezo element through said inductor element in accordance with an injection signal outputted from an external control device,
wherein at least a part of said housing is made of magnetic material, and said housing is used as a core of said inductor element.

10. The piezo injector system according to claim 9, wherein said inductor element is disposed outside said piezo injector driving apparatus.

* * * * *